United States Patent [19]

Honma et al.

[11] Patent Number: 5,177,568
[45] Date of Patent: Jan. 5, 1993

[54] TUNNEL INJECTION SEMICONDUCTOR DEVICES WITH SCHOTTKY BARRIERS

[75] Inventors: Hideo Honma, Hitachi; Sumio Kawakami, Hitachiota; Takahiro Nagano, Hitachi, all of Japan

[73] Assignee: Hitachi, Ltd., Tokyo, Japan

[21] Appl. No.: 738,604

[22] Filed: Jul. 30, 1991

[30] Foreign Application Priority Data

Aug. 3, 1990 [JP] Japan ................. 2-205005

[51] Int. Cl.⁵ .......................................... H01L 29/48
[52] U.S. Cl. ................... 257/295; 257/408; 257/377; 257/384; 257/382; 257/473
[58] Field of Search ............ 357/23.6, 15, 23.4, 357/67 S, 59 I, 59 G, 23.5, 42, 23.7

[56] References Cited

U.S. PATENT DOCUMENTS

| 4,690,730 | 9/1987 | Tang et al. | 357/23.4 X |
| 5,026,657 | 6/1991 | Lee et al. | 357/23.6 X |
| 5,049,953 | 9/1991 | Mihara et al. | 357/15 |
| 5,061,981 | 10/1991 | Hall | 357/15 X |

FOREIGN PATENT DOCUMENTS 62-274775  11/1987  Japan .

Primary Examiner—William Mintel
Attorney, Agent, or Firm—Antonelli, Terry, Stout & Kraus

[57] ABSTRACT

A tunnel injection type semiconductor device having an MIS structure comprising a semiconductor region, a source, a drain and a gate electrode, wherein said source and said drain are composed of a metal or metal compound member, respectively, and wherein both have an overlapping portion with said gate electrode. A first conductivity type high impurity concentration semiconductor layer is formed in said semiconductor region in contact with and contiguous to said metalic member at the drain side. The source provides a Schottky barrier junction to said semiconductor region while said drain provides an ohmic contact to said semiconductor region. Using this structure a tunneling current flowing across a Schottky barrier junction between said source and said drain is controlled by a gate voltage.

4 Claims, 12 Drawing Sheets

A STATE OF DEPLETION LAYER AND ITS BAND STRUCTURE AT $V_G=0, V_D>0$

A STATE OF DEPLETION LAYER AND ITS BAND STRUCTURE AT $V_G>V_D>0$

A STATE OF DEPLETION LAYER AND ITS BAND STRUCTURE AT $V_G \cong V_D>0$

A STATE OF DEPLETION LAYER AND ITS BAND STRUCTURE AT $V_D>V_G>0$

TUNNEL INJECTION SEMICONDUCTOR DEVICES WITH SCHOTTKY BARRIERS

BACKGROUND OF THE INVENTION

The present invention relates to a structure of a semiconductor device suitable for enhancing integration density and high performance, and its manufacturing process. More particularly, the present injection type semiconductor devices.

In accordance with the increasing capacities in VLSIs typified by DRAMs, it is required for the semiconductor devices to be implemented therein to have a highly dense integration structure. A number of problems, however, have arisen with such efforts to increase integration densities as will be discussed below.

For example, regarding MOSFETS, which are the typical semiconductor devices, further reduction in dimension is considered difficult to realize because of the following: (1) variations in characteristics due to the short channel effect, (2) decrease in withstand voltage due to the parasitic bipolar effects, (3) possible threshold voltage variation due to the statistical fluctuation of impurities, (4) an increase in a leakage current due to the increased impurity concentration, and so on.

One of the ways to solve the above-mentioned problems above, has been proposed in Japanese Patent Publication No. 62-274775 (1987), wherein a tunneling current flowing through the Schottky barrier junction is controlled by means as set forth therein.

The aforementioned prior art semiconductor device utilizing the prior art tunneling current control techniques has an unsymmetrical structure which is rather difficult to fabricate. Specifically, in this device the source is formed of metal while the drain is formed of an $n^-$-semiconductor layer. In addition, another arises because a connection wiring from said $n^-$-layer must be extended through the contact hole to the electrode wiring layer, thereby lengthening a carrier path. Further, contact resistance added up between the $n^-$-layer and the wiring causes the parasitic resistance to increase, thereby decreasing the drain (tunneling) current.

SUMMARY OF THE INVENTION

A major object of the present invention is to provide an optimized semiconductor device structure capable of reducing dimensions for denser integration, and its process of manufacture.

Another object of the present invention is to provide an optimum semiconductor device to be applied to high speed switching operations.

The characteristic features of the present invention contemplated for attaining the above-mentioned objects are as follows:

1. A semiconductor device having an MIS structure comprising a semiconductor region, a source, a drain and a gate electrode wherein, said source and said drain are composed of a metal or metal compound member, respectively, and wherein both have an overlapping portion with said gate electrode. A first conductivity type high impurity concentration semiconductor layer is formed in said semiconductor region in contact and contiguous to said metallic member at the drain side. The source provides a Schottky barrier junction to said semiconductor region while the drain provides an ohmic contact to said semiconductor region. A tunneling current flowing across a Schottky barrier junction between said source and said drain is controlled by a gate voltage.

2. A semiconductor device having a first conductivity type semiconductor region: a pair of regions made of a metal or metal compound disposed apart from each other on the surface of said first conductivity type semiconductor region and a control electrode provided on the surface of said first conductivity type semiconductor region by interposing an insulation film therebetween, covering a region between said pair of regions. One of the said pair of regions has a first conductivity type high impurity concentration region along a portion in contact and contiguous to said first conductivity type semiconductor region.

3. An arrangement wherein a first conductor, a first conductivity type low impurity concentration semiconductor, a first conductivity type high impurity concentration semiconductor, and a second conductor are formed successively in contact. The structure includes means for varying the carrier concentration in said low impurity concentration semiconductor. A tunneling current flowing across a Schottky barrier junction formed at the boundary between said first conductor and said low impurity concentration semiconductor is controlled through varying said carrier concentration.

4. An arrangement wherein a prescribed insulating substrate is provided and a first conductor, a first conductivity type low impurity concentration semiconductor, a first conductivity type high impurity concentration semiconductor, and a second conductor are formed successively on said insulating substrate in contact and contiguous to one another. A control electrode is also formed, with an insulation film interposed, on the surface opposite to said insulating substrate of said first conductor, said first conductivity type low impurity concentration semiconductor, said first conductivity type high impurity concentration semiconductor, and said second conductor.

5. An arrangement wherein a prescribed insulating substrate is provided wherein a first conductor, a first conductivity type low impurity concentration semiconductor, a first conductivity type high impurity concentration semiconductor and a second conductor are formed successively on said insulating substrate in contact and contiguous to one another. A third conductor, a second conductivity type high impurity concentration semiconductor, a second conductivity type low impurity concentration semiconductor and a fourth conductor disposed apart from said second conductor isolated by an insulation region are also formed sucessively in contact and contiguous to one another. A first control electrode is formed on the surface opposite to said insulating substrate with an insulation film interposed therebetween above said first conductor, said first conductivity type low impurity concentration semiconductor, said first conductivity type high impurity concentration semiconductor and said second conductor. A second control electrode formed on the surface opposite to said insulating substrate with an insulation film interposed therebetween above said third conductor, said second conductivity type low impurity concentration semiconductor and said fourth conductor invention relates to semiconductor devices suitable for use as tunnel the same signal is input to the first control electrode and the second control electrode, then, the same output signal is put out from the second conductor and the third conductor.

6. A process of manufacturing a semiconductor device according to the steps comprising the following:
(1) a step of preparing a prescribed first conductivity type semiconductor substrate;
(2) a step of forming a second conductivity type semiconductor region on the semiconductor substrate;
(3) a step of forming a control electrode on the surface of the semiconductor region with an insulation film interposed therebetween;
(4) a step of forming a second conductivity type high impurity concentration semiconductor layer in the above semiconductor region;
(5) a step of depositing a metal on the surface of the above semiconductor region;
(6) a step of heat treating the above semiconductor substrate; and
(7) a step of removing the above deposited metal.

According to a semiconductor device, i.e., the transistor of the present invention, there have been provided such features as follows to solve the problems associated with the prior art MOSFETs: (1) in principle of operation, because of a mechanism of controlling tunneling electrons flowing through a Schottky barrier junction through a mode of bending or curvature of the band on the surface of the semiconductor substrate subjected to a potential at the control electrode (gate), the problem of short channel effect is virtually eliminated (channel length modulation effect). (2) since the barrier between the source and drain being only a Schottky barrier junction, there occurs no parasitic bipolar effect; and (3) a carrier concentration in an accumulated layer is determined and controlled almost entirely by the thickness of a gate oxide layer and a barrier height $\phi_B$ at the Schottky barrier junction, permitting for the semiconductor substrate to have a low impurity concentration, so that hardly any variation occurs of a threshold voltage due to a statistical fluctuation of impurities, and hardly any increase in a leakage current due to an increased impurity concentration, and so on.

Further, according to the present invention, because a conductor consisting of a metallic member is provided both at the source and drain sides symmetrically buried under the control electrode (gate), it is possible for the carriers (electrons) which are injected from the source readily to be transported to the metallic member at the drain side having a small resistivity only by passing through an n$^-$-layer (or p$^-$-layer in case of a p-type transistor) which is a sufficiently narrow width high impurity concentration layer providing an ohmic contact between the well region and the drain side metallic member. Further, as for a contact resistance between the electrode wiring layer and the n$^-$-layer, it is determined almost entirely by a contact resistance between the metallic member at the drain and the n$^-$-layer having a large contact area therebetween because there is almost no contact resistance between the metallic member at the drain and the electrode wiring layer, which, however, is sufficiently small. Thereby it is possible to minimize a parasitic resistance between the source and drain while maximizing a drain (tunneling) current. Still further, the process of manufacture is simplified because the metallic members are capable of being provided symmetrically at the source and drain.

Still further, for example, the bottom surface of the metallic member at the source side is surrounded by a high impurity concentration semiconductor layer of an opposite conductivity to that of the semiconductor substrate (well region), thereby the bottom portion of the source forms a p-n junction to the semiconductor substrate instead of a Schottky barrier junction. Because the p-n junction is a small number carrier element, a leakage current thereof can be reduced by several orders of figures than that of a Schottky barrier junction. This is equivalent substantially to removing the bottom portion of the metallic member at the source, so that even when a material having a small $\phi_B$ is utilized as the source electrode, its leakage current can be suppressed to a minimum.

Still further, because at least the bottom surface of the source/drain is disposed in contact with the insulating substrate comprised of $SiO_2$, a parasitic capacitance at the drain is negligibly small. Likewise, a parasitic capacitance at the source side can be made smaller. In addition, because there exists no Schottky barrier junction in the bottom portion of the metallic member at the source side, a substantial reduction in the leakage current can be effected. Thereby, increasingly faster speed operations of switching circuits or the like can be attained. Still further, because the silicon film (well region) is maintained at the same potential as the drain, there occurs no kink phenomena or the like problems due to the floating of the well potential, which problems have been observed in the prior art Silicon-On-Insulator (SOI) type MOSFETs.

The other objects and functions of the present invention will be appreciated from the descriptions of embodiments to be set forth in the following.

DETAILED DESCRIPTION OF THE EMBODIMENTS

Embodiment 1

Figure 1A:
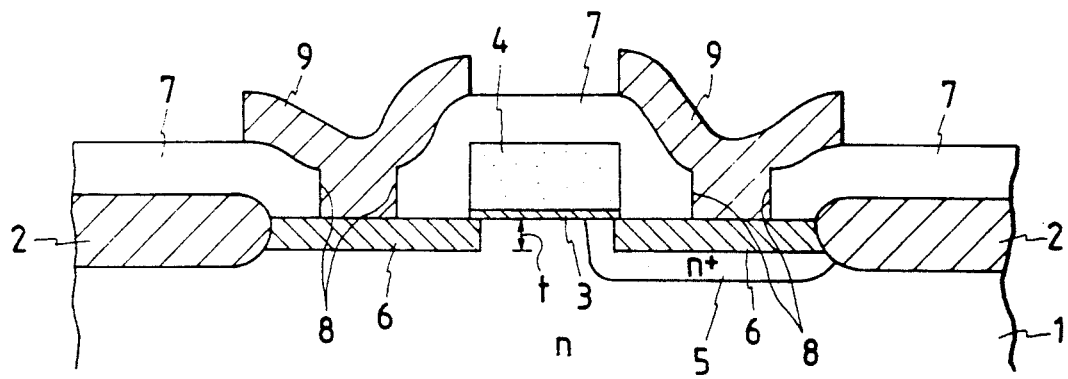
FIGS. 1(a) and 1(b) show a first embodiment of a tunnel injection transistor according to present invention, with FIG. 1(a) providing a cross-sectional view and FIG. 1(b) providing a plane view.
Figure 1B:
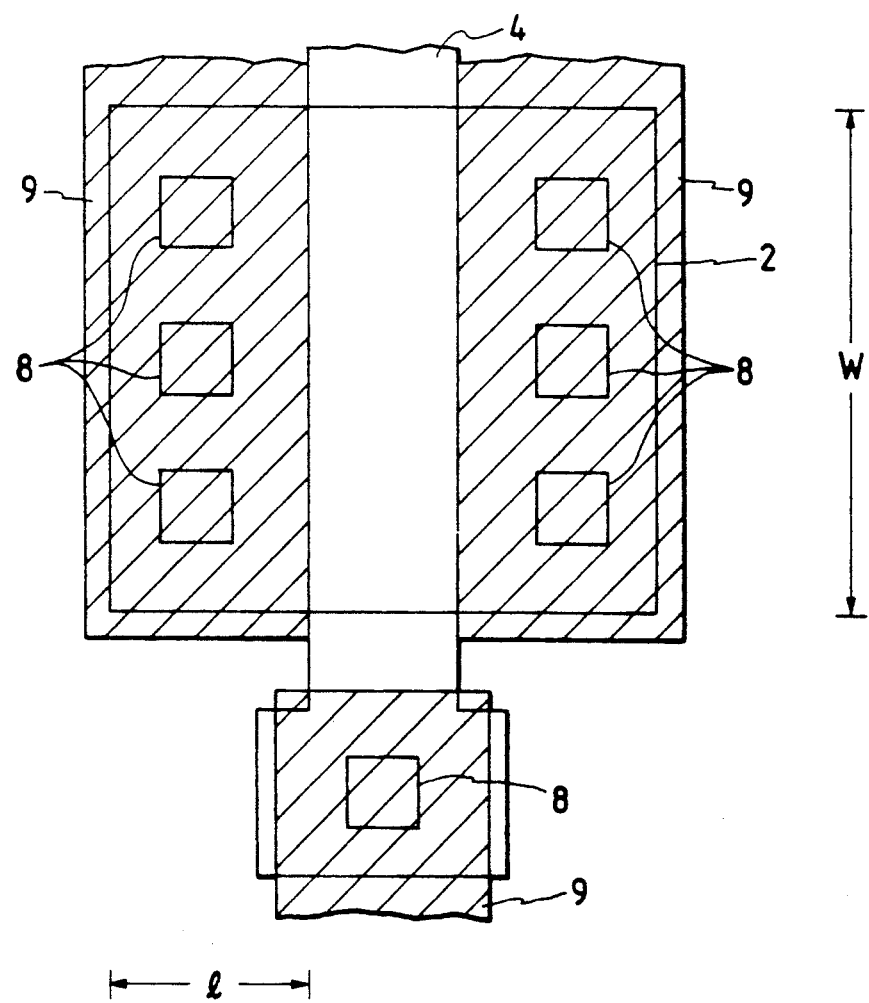

FIG. 1(a) is a cross-sectional view of an n-type tunnel injection transistor of a preferred embodiment of the present invention, which comprises: a low impurity concentration n-type semiconductor substrate 1, a field oxide film ($SiO_2$)2 which defines an active region, a gate oxide film ($SiO_2$)3, a gate electrode 4 made of $n^-$-polycrystalline silicon, titanium silicide regions ($TiSi_2$)6 formed symmetrically at the source and drain sides buried in said substrate 1 partially overlapping with the gate electrode thereupon, a high impurity concentration $n^-$-type semiconductor layer 5 surrounding the $TiSi_2$ region 6 at the drain side, an insulating layer (BPSG/$Si_2O_2$)7, and an electrode wiring layer 9 connected through a contact through-hole 8. FIG. 1(b) shows a plane view of FIG. 1(a).

By referring to FIGS. 2 and 3, the principle of operation of the transistor of the preferred embodiment will be described below. Because $TiSi_2$ at the drain side in FIG. 1 is disposed in contact with the $n^-$ layer 5, the expansion of a depletion layer thereof is minimized so as to form a so-called ohmic contact therebetween permitting carriers freely to pass through as they are. For the sake of simplification, silicides at the drain are omitted in FIGS. 2 and 3. FIGS. 2(a) to 2(d) illustrate extension of depletion layers in the device under various bias conditions, and associated band structures along lines A—A'. FIGS. 3(a) to 3(d) show the result of calculation of equi-potential lines between the source and drain under various bias conditions.

Figure 2A:
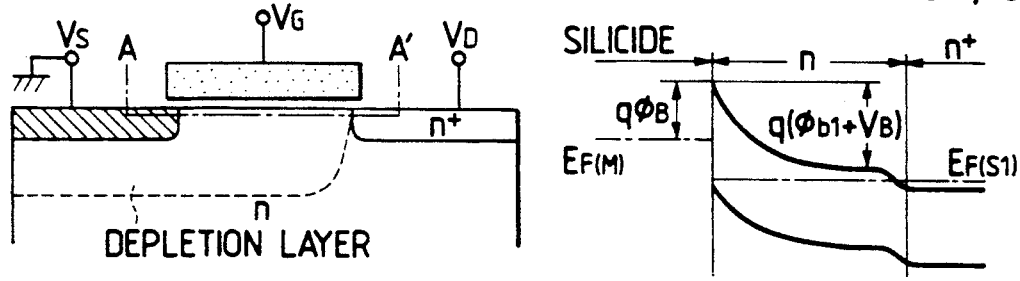
FIGS 2(a) and 2(d) illustrate extension of depletion layers and band structures in the device under various bias conditions.
Figure 3A:
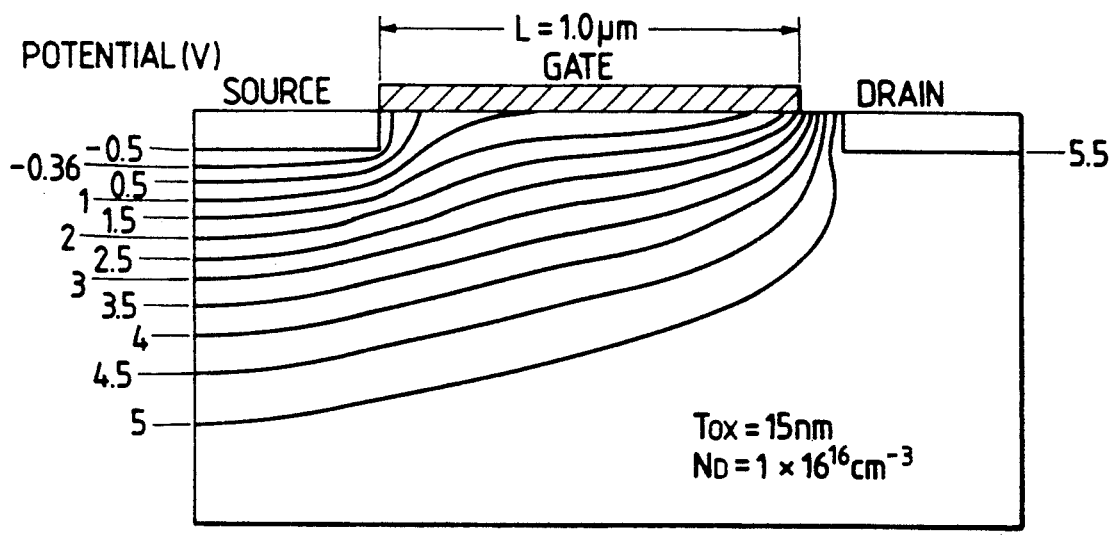
FIGS. 3(a) to 3(d) show the result of calculation of equi-potential lines between the source and drain under various bias conditions.

FIG. 2(a) and FIG. 3(a) are the results obtained under a bias condition that $V_G=0$, and a drain voltage $V_D>0$. When no voltage is applied to the gate, a depletion layer expands according to a sum of a diffusion potential $\phi_{bi}$ and $V_D$ along the Schottky barrier junction. A width of the depletion layer i.e., the (Schottky barrier width) is sufficiently large and its potential is distributed uniformly between the source and drain. Therefore, no tunnel injection occurs except for a slight amount of a leakage current flowing due to the reverse direction characteristics of a Schottky barrier diode.

Figure 2B:
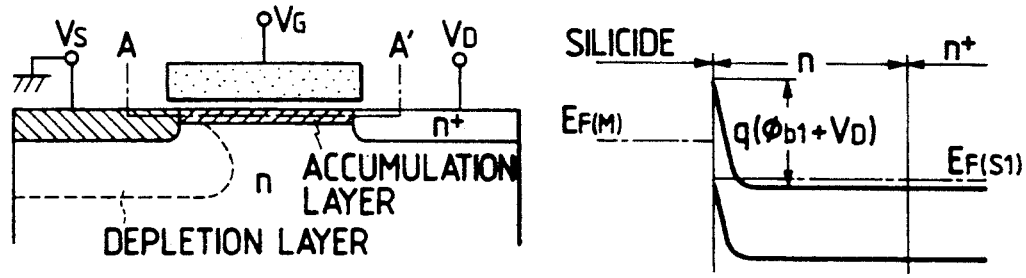
Figure 3B:
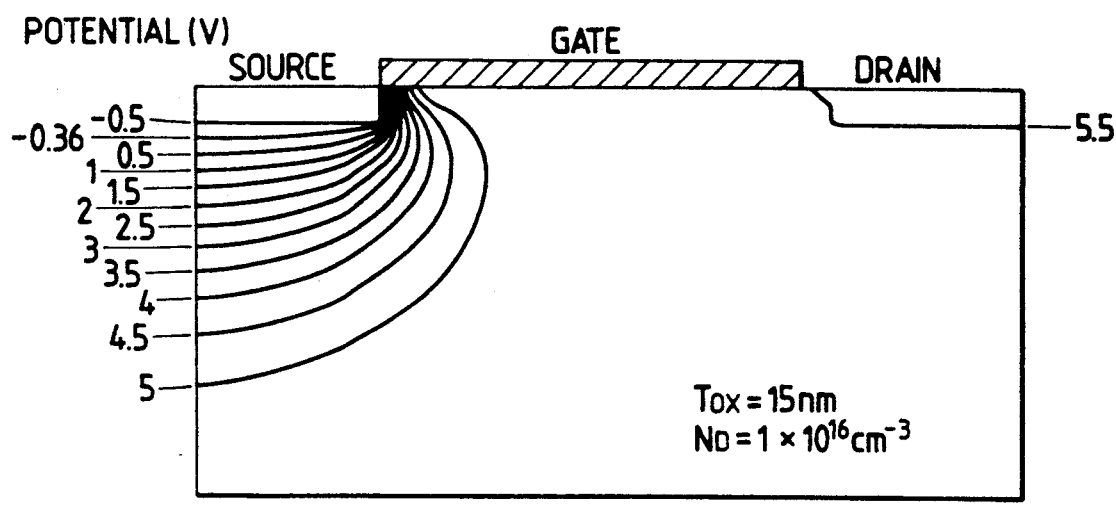

In FIG. 2(b) and FIG. 3(b), bias conditions were differentiated from the cases (a) by applying a larger positive potential to $V_G$ than $V_D$ in such a relation as $V_G>V_D>0$. Because of the potential of $V_G$, a depletion layer band in the n-substrate directly beneath the gate is bent, and an accumulation layer of electrons is formed uniformly between the source and drain. As a result, as is obvious from the potential distribution, the depletion layer of the Schottky barrier junction is contracted toward the source front, thereby permitting electron injection from the source into the n-substrate and permitting a tunneling current to flow from the drain to the source.

Figure 2C:
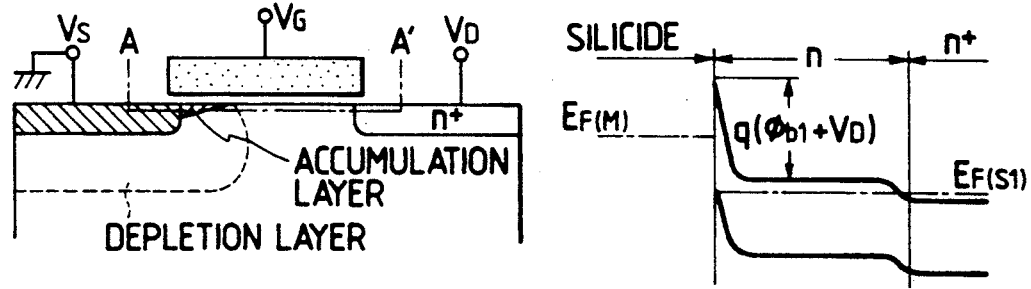
Figure 3C:
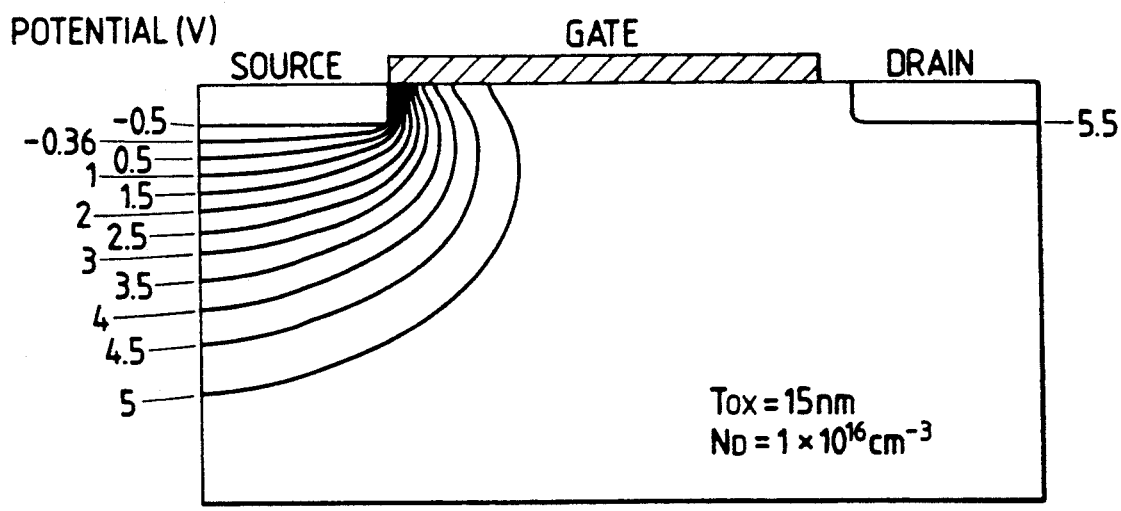

FIG. 2(c) and FIG. 3(c) show cases where $V_G$ and $V_D$ are approximately the same. At approximately the same potential of $V_G$ and $V_D$, potential in the n-substrate at the drain side is pulled up to $V_D$, so that the accumulation layer diminishes in the vicinity of the drain. However, because potential of the n-substrate at the source end is constantly fixed at the source potential (0) irrespective of $V_D$, there remains in the vicinity of the source end an accumulation layer of electrons having a density corresponding to $V_G$, thus permitting the tunneling current to flow therethrough.

Figure 2D:
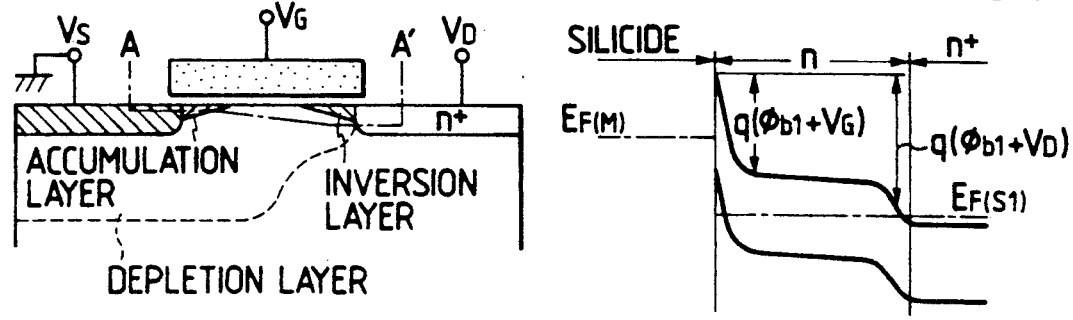
Figure 3D:
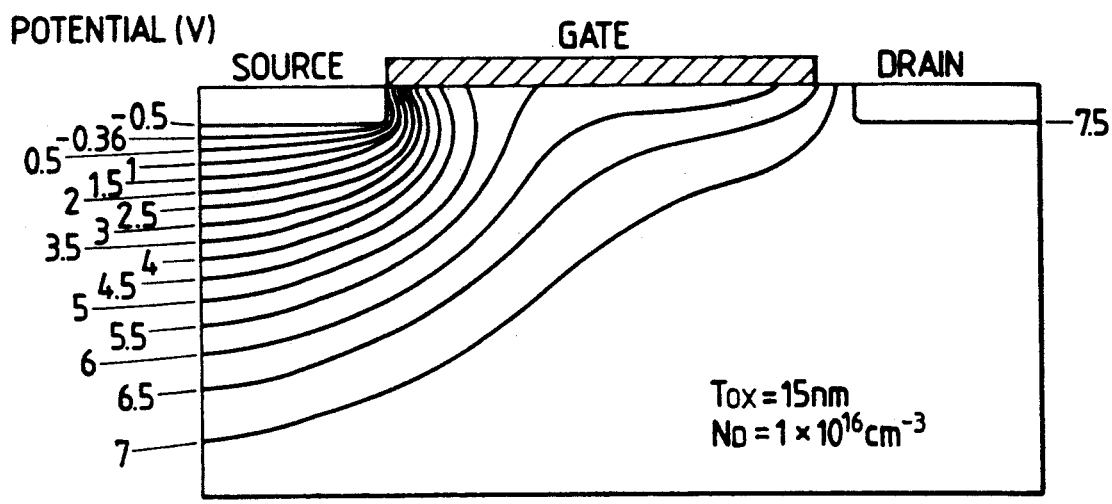

FIG. 2(d) and FIG. 3(d) represent conditions wherein $V_D$ was increased from the case (c) to such that $V_D \geq V_G 0$. Under such bias conditions, a p-type inversion layer is formed directly beneath the gate in the vicinity of the drain, thus, permitting the depletion layer again to expand up to the drain front. As observed obviously from the potential distribution, however, a difference in potentials (i.e., $V_D-V_G$) is shared between the accumulation layer end and the drain end. Namely, for $V_D>V_G$, potentials at the ends of the accumulation layers are fixed approximately at $V_G$, and a tunneling current is saturated by a difference in potentials when $V_D$ exceeds $V_G$.

Figure 4:
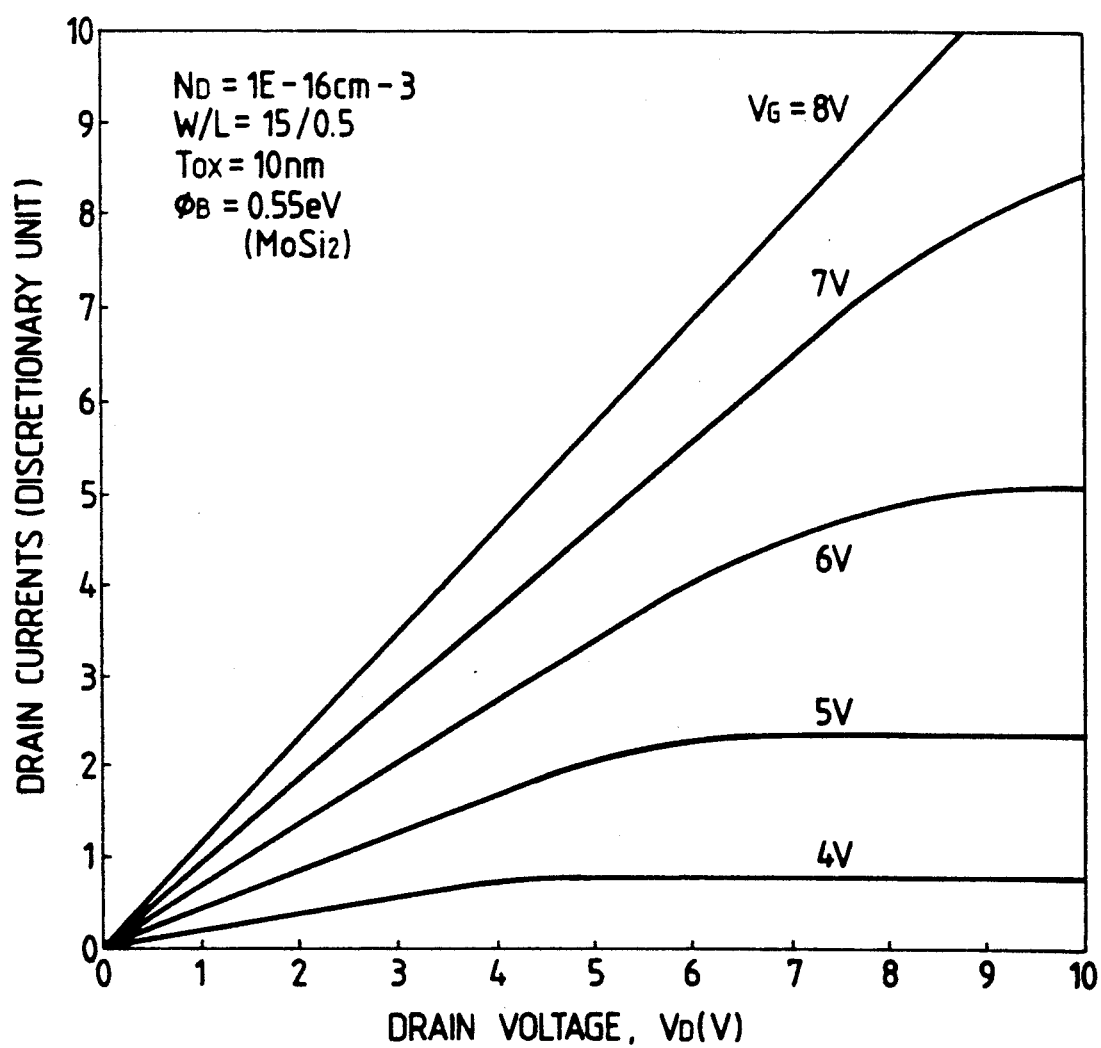
FIG. 4 shows the static characteristics of the transistor according to the present invention.

As hereinabove described, according to the tunnel injection transistor of the present invention, current saturation characteristics having smaller values than that of the prior art MOSFETs are obtained as shown in the $V_D-I_D$ characteristics in FIG. 4.

As can be appreciated from FIG. 1, because $TiSi_2$ members 6 are provided symmetrically in the source and drain, partially buried underneath the gate electrode 4, it is readily possible for carriers (electrons) injected from the source to reach the low resistance $TiSi_2$ region 6 at the drain side only passing through $n^-$-layer 5 having a sufficiently narrow width. Further, because there exists almost no contact resistance between $TiSi_2$ region 6 in the drain and the electrode wiring layer 9, a contact resistance between the electrode wiring layer 9 and the $n^-$-layer 5 is determined substantially by a contact resistance which exists between the $TiSi_2$ region 6 of the drain and the $n^-$-layer 5. Although the contact area between the region 6 and the layer 5 is relatively large, the contact resistance is relatively small. Thereby, a parasitic resistance between the drain and source is capable of being reduced, thus increasing the drain (tunneling) current. Still further, because $TiSi_2$ region 6 are provided symmetrically in the source and drain, the process of its manufacture is substantially simplified.

Figure 5:
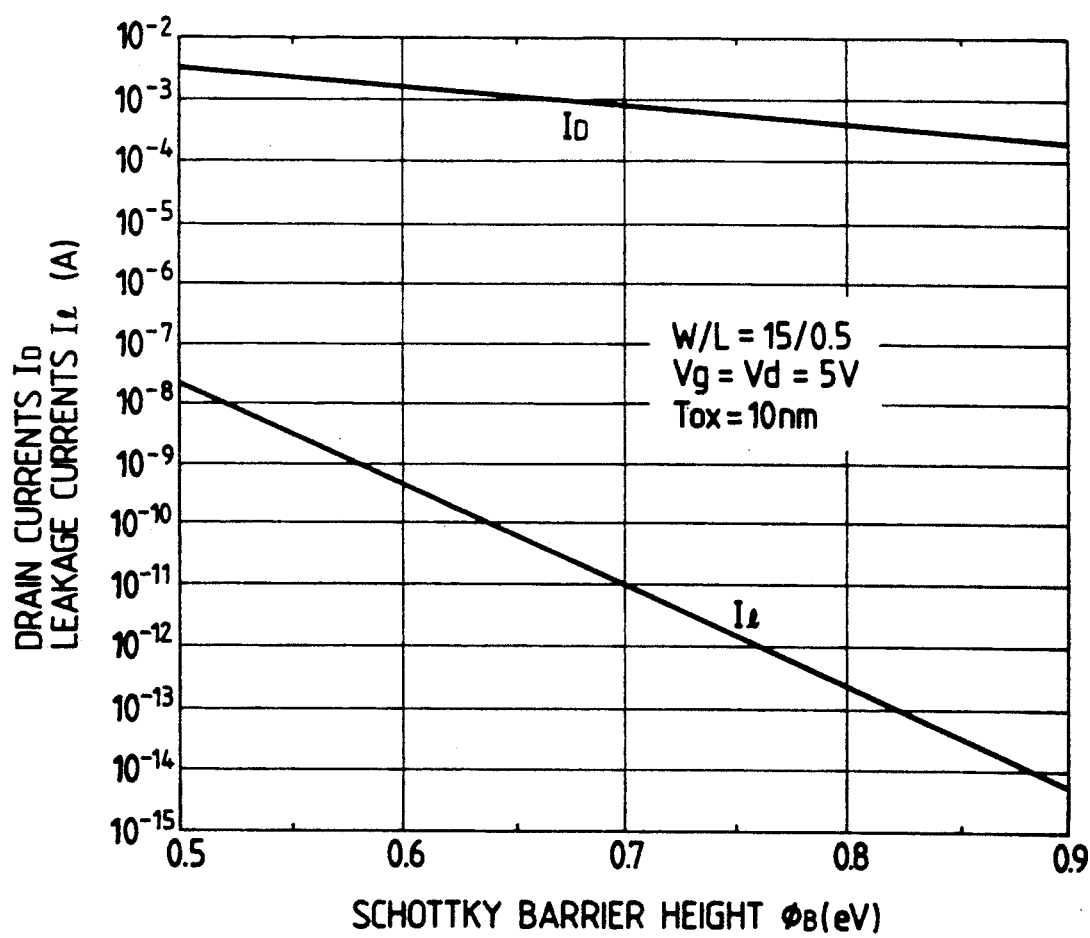
FIG. 5 shows the relationships between schottky barrier height and drain current/leakage current.

On the other hand, in order to obtain a larger drain current, it is necessary to employ such material for the source that has a smaller value in the Schottky barrier height $\phi_B$. In this case, however, a problem arises that a leakage current also increases. FIG. 5 shows relationships between drain current $I_D$ and $\phi_B$, and leakage current $I_1$ and $\phi_B$, respectively, under the conditions that gate width $W=15$ μm, gate length $L=0.5$ μm, gate oxide film thickness $T_{OX}=10$ nm, and $V_G=V_D=5V$. By decreasing $\phi_B$, $I_D$ can be increased. The leakage current $I_1$, however, increases remarkably because of the properties of the Schottky barrier diode. As has been described previously, a drain (tunneling) current is injected into an extremely small area in which an accumulation layer and the metallic member meet each other. Thus, at least the bottom surface of the $TiSi_2$ region 6 at the source side in FIG. 2 is an unnecessary region in view of the principle of the device's operation. Should the unnecessary region be removed, the leakage current $I_1$ could be reduced, because the leakage current is proportional to a contact area of the $TiSi_2$ region 6 of the source.

Figure 6:
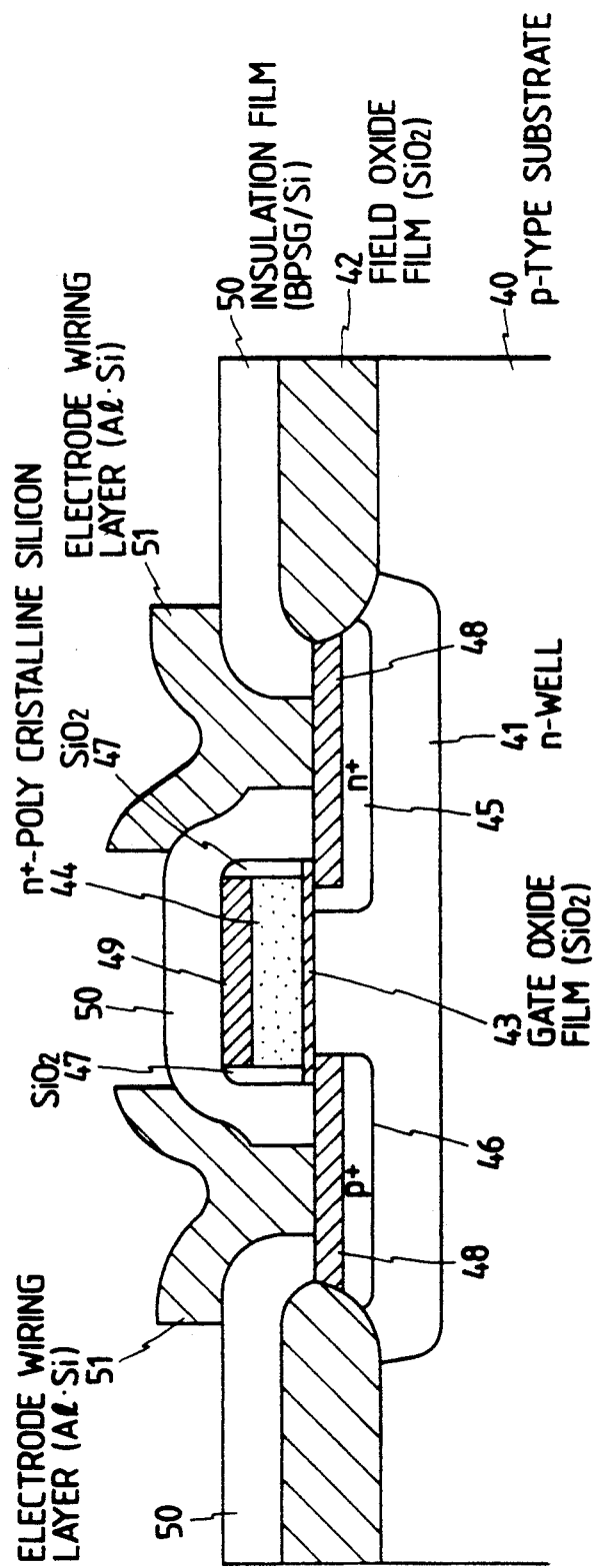
FIG. 6 shows a cross-sectional view of a second embodiment of the tunnel injection transistor according to the present invention.
Figure 7A:
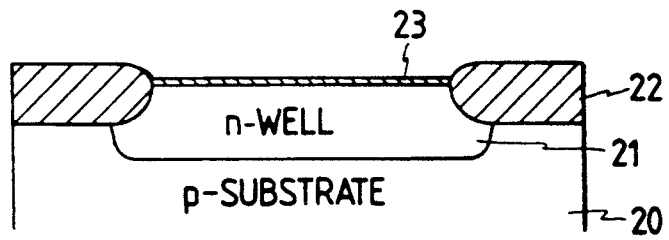
FIGS. 7(a) to 7(e) show exemplary steps of fabrication of a transistor similar to that of FIGS. 1(a) and 1(b)
Figure 7B:
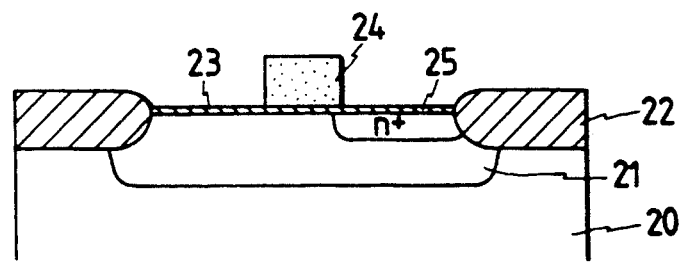
Figure 7C:
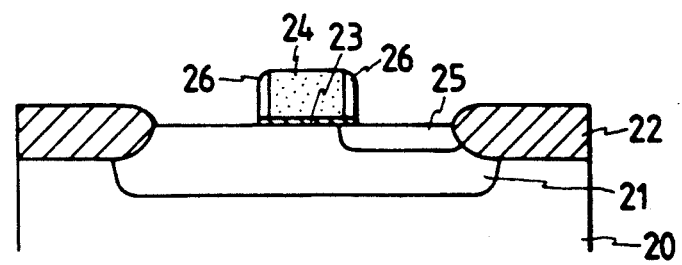
Figure 7D:
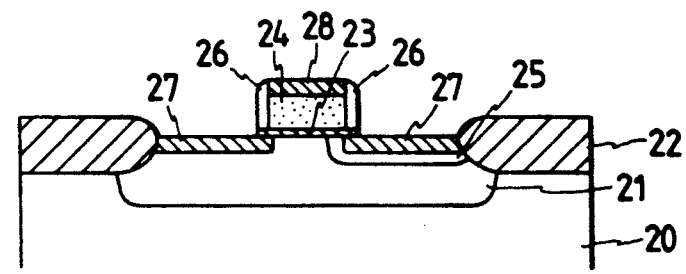
Figure 7E:
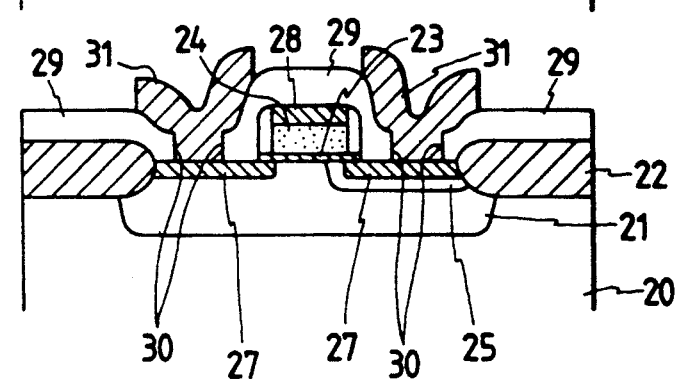

Another embodiment of the present invention as shown in FIG. 6 is contemplated based on the idea described above.

Embodiment: 2

FIG. 6 shows a cross-sectional view of an n-type tunnel injection transistor of another embodiment of the present invention, which comprises: a p-type substrate 40; a low impurity concentration n-type well region 41; a field oxide film ($SiO_2$)42 which defines an active region; a gate electrode made of layers of a gate oxide film ($SiO_2$)43, an $n^-$-polycrystalline silicon 44 and titanium silicide ($TiSi_2$)49; a thin film insulation layer ($SiO_2$)47 formed on the side periphery of the gate; titanium silicide $TiSi_2$48 formed symmetrically in the source and drain within said well region 41, portions of which are buried beneath the gate electrode which is partially overlaid; a high impurity concentration $n^-$-type semiconductor layer 45 formed surrounding the periphery of $TiSi_2$48 at the drain; a high impurity concentration $p^-$-type semiconductor layer 46 formed surrounding the bottom surface of $TiSi_2$48 at the source; an insulating layer (BPSG/$SiO_2$)50; and an electrode wiring layer 51 for extending connection of the source/drain or the gate to the outside. Because the bottom surface of $TiSi_2$48 at the source is surrounded by the high impurity concentration $p^-$-type semiconductor layer 46 in this transistor, the bottom surface portion of the source provides a p-n junction instead of a Schottky barrier junction to the n-well region 41. The p-n junction being a small number carrier element, is capable of reducing its leakage current by several orders of magnitude than the Schottky barrier junction. Thereby an effect equivalent to having removed the bottom portion of $TiSi_2$48 at the source is obtained, thus permitting the use of materials as a source electrode, which have a smaller $\phi_B$ value, while minimizing the leakage current.

When a plurality of such transistors formed on the same substrate constitutes a switching circuit, its switching speed may be delayed due to a parasitic capacitance induced in their drains. For example, because the drain in FIG. 6 has the same potential as that of the n-well region 41, the drain is subjected to a large parasitic capacitance induced between the n-well region 41 and the p-type substrate 40, thereby delaying its switching speed.

Embodiment: 3

Figure 8:
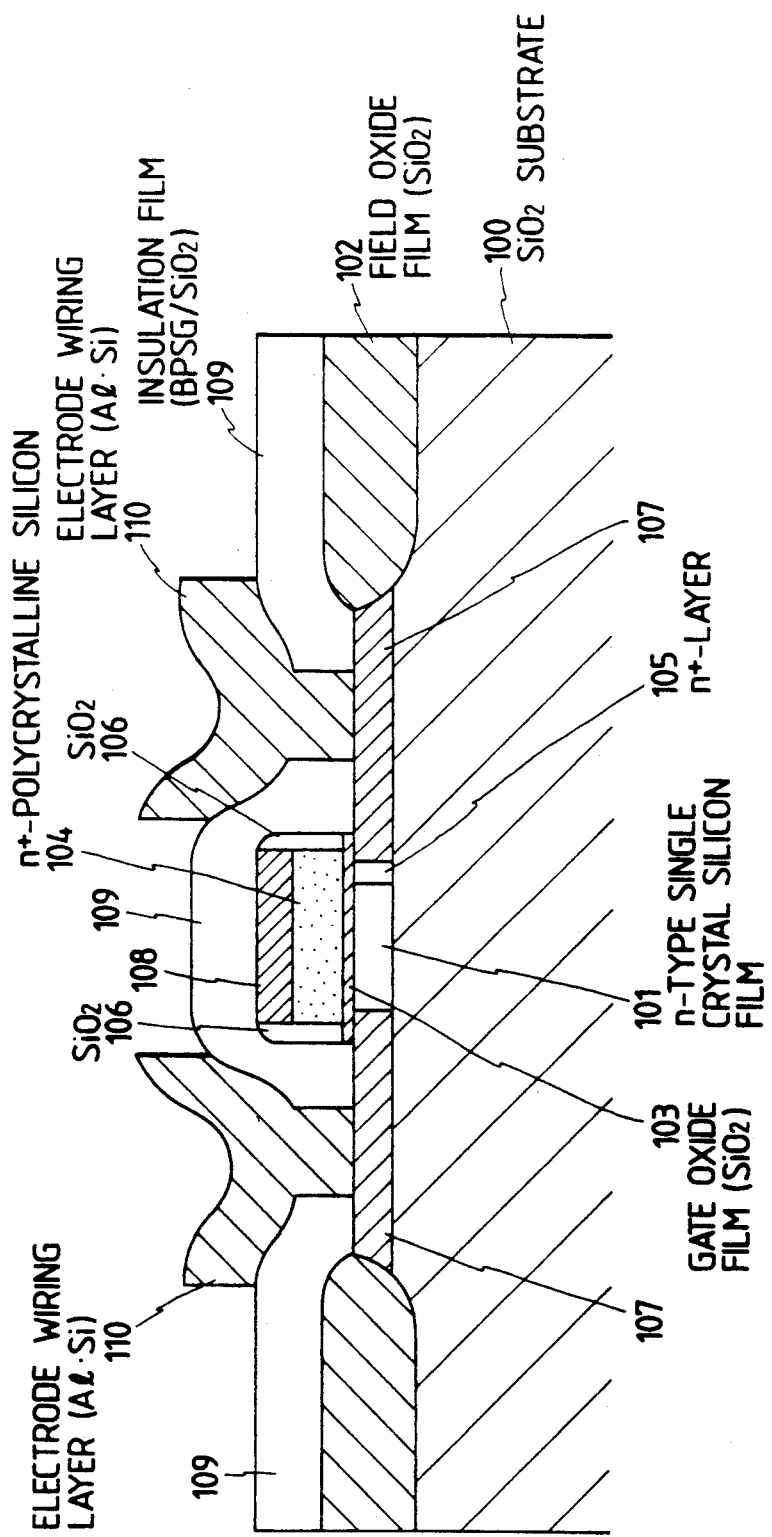
FIG. 8 shows a cross-sectional view of a third embodiment of the tunnel injection transistor according to the present invention.

FIG. 8 shows an SOI type n-type tunnel injection transistor of another embodiment of the present invention contemplated to solve the hereinabove discussed problems. This embodiment comprises in combination: an n-type single crystal silicon layer 101 formed on the surface of a $SiO_2$ substrate 100; a field oxide film ($SiO_2$)102 which defines an active region; a gate electrode made up of layers of a gate oxide film ($SiO_2$)103, an $n^-$-polycrystalline silicon 104 and titanium silicide ($TiS_2$)108; a thin film insulation layer ($SiO_2$)106 formed on the side periphery of the gate; titanium silicide ($TiSi_2$)107 formed symmetrically at the source and gate in said n-type silicon film 101, partially buried underneath the gate electrode, and the bottom surfaces being in contact with said $SiO_2$ substrate 100; a high impurity concentration $n^-$-type semiconductor layer 105 formed between $TiSi_2$107 at the drain and the n-type silicon layer 101; an insulating layer (BPSG/$SiO_2$)109; and an electrode wiring layer 110 for extending connections of the source/drain or the gate to the outside. Because at least the bottom surfaces of $TiSi_2$107 at the source and drain are in direct contact with the $SiO_2$ substrate 100, a parasitic capacitance in the drain is negligibly small.

The parasitic capacitance at the source is reduced likewise. In addition, because the bottom portion of $TiSi_2$107 at the source side forms no Schottky barrier junction, the leakage current is substantially reduced. As a result, the switching speed of a switching circuit or the like can be further enhanced. Still further, because the n-type silicon film 101 in this transistor as described above is at the same potential as the drain, there occurs no kink phenomena or similar problems such as those that have been observed in the prior art SOI type MOSFETs due to the floating of well potential. It is preferable for said $n^-$-layer to have a concentration at its surface of approximately $10^{20} cm^{-3}$, and for the $p^-$-layer to have about 10 times a larger an impurity concentration as that of the substrate, through $10^{20} cm^{-3}$.

Still another embodiment of the present invention will be described in the following.

Embodiment: 4

FIG. 7 shows cross-sectional views of an n-type tunnel injection transistor similar to that of FIG. 1 according to its fabrication steps. An n-well region 21 having a concentration of approximately $10^{16} cm^{-3}$ is formed in a prescribed region on a p-type silicon substrate 20 by diffusing phosphorous (P) atoms therein. Referring to FIG. 7(a), a field oxide film ($SiO_2$)22 is formed surrounding the n-well region 21 by the selective oxidation technique, then, a gate oxide film 23 composed of $SiO_2$ having a 8 nm thickness is formed on the surface of said n-well region. Next, a gate electrode 24 is formed through deposition of $n^-$-polycrystalline silicon over the entire surface by CVD techniques, followed by photo-etching techniques to form the same into a desired shape. Then, in reference to FIG. 7(b), after masking a photo-resist, arsenic (As) ions are injected into the drain region at 20 KeV, $5 \times 10^{15} cm^{-2}$, then heat treatment are made at 900° C. for 20 minutes to form an $n^-$-diffusion layer 25. Subsequently, referring to FIG. 7(c), a $SiO_2$ film is deposited on the entire surface by the CVD techniques, then said $SiO_2$ film is etched off by reactive-ion-etching (RIE) techniques to form a thin $SiO_2$ film 26 on the side wall of the gate electrode 24, while, at the same time, exposing the surfaces of the source/drain and the gate electrode as well. Next, with reference to FIG. 7(d), a Mo film is sputter-deposited on the entire surface to a thickness of 50 nm, then heat treatment are made at 600° C. for 20 sec. by lamp annealing to form $MoSi_2$ portions 27, 28 only in said exposed silicon surfaces. Unreacted Mo is removed with nitric acid. Next referring to FIG. 7(e), after depositing a double layer insulation film 29 made of BPSG/$SiO_2$, by CVD techniques, a contact through-hole 30 is formed reaching the $MoSi_2$ films at the source/drain and the gate by photo-etching techniques. Finally, after depositing an Al·Si film over the entire surface to a thickness of 500 nm by sputtering, said Al·Si film is formed into a desired shape by photoetching techniques to form an electrode wiring layer 31, thus accomplishing the formation of an n-type tunnel injection transistor.

This exemplary transistor is capable of obtaining an increased drain (tunneling) current because of a parasitic capacitance sufficiently reduced between the source and drain, as has been explained with regard to FIG. 1.

Embodiment: 5

Figure 9:
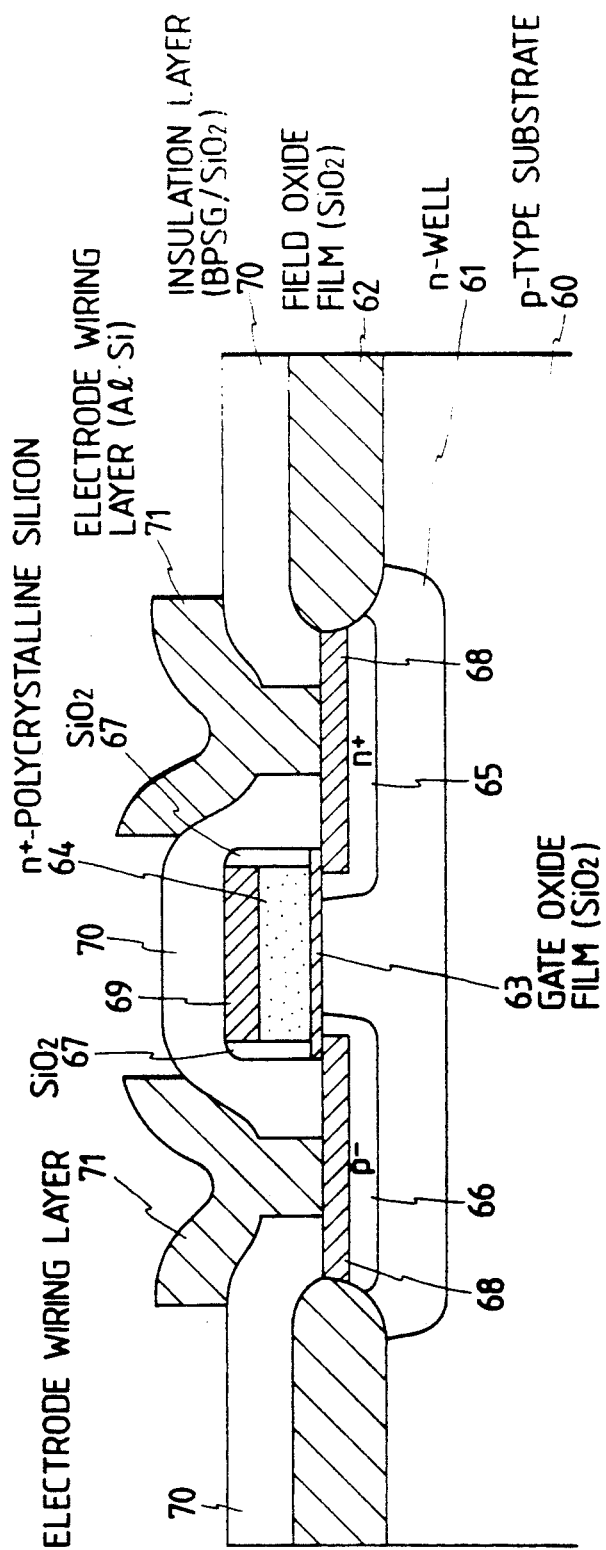
FIG. 9 shows a cross-sectional view of a fourth embodiment of the tunnel injection transistor according to the present invention.

FIG. 9 shows a cross-sectional view of an n-type tunnel injection transistor of still another embodiment of the present invention wherein a leakage current is controlled in a manner like that sown in FIG. 6. The embodiment comprises: a p-type substrate 60; a low impurity concentration n-type well region 61; a field oxide film (SiO$_2$)62 which defines an active region; a three-layered gate electrode made up of a gate oxide film (SiO$_2$)63, an n$^-$-polycrystalline silicon 44 and vanadium silicide (VSi$_2$)69; a thin film insulation layer (SiO$_2$)67 formed on the side periphery of the gate; VSi$_2$68 formed symmetrically in the source and drain within said well region 61, partially overlaid by the gate electrode; a high impurity concentration n$^-$-type semiconductor layer 65 formed so as to surround the periphery of VSi$_2$68 at the drain side; a low impurity concentration p-type semiconductor layer 66 formed so as to surround the bottom and the side surface of VSi$_2$68 at the source side; an insulation layer (BPSG/SiO$_2$)70; and an electrode wiring layer 71 for extending connection of the source/drain and the gate to the outside. In this exemplary transistor, the bottom and side surface of VSi$_2$68 at the source are surrounded by the low impurity concentration p-type semiconductor layer 66. By setting the impurity level of said p-type semiconductor layer 66 appropriately such that only a leakage current in the reverse direction is reduced without affecting forward characteristics (V$_F$) of the Schottky barrier junction, the leakage current is capable of being reduced remarkably without lowering the drain (tunneling) current.

EMBODIMENT: 6

Figure 10:
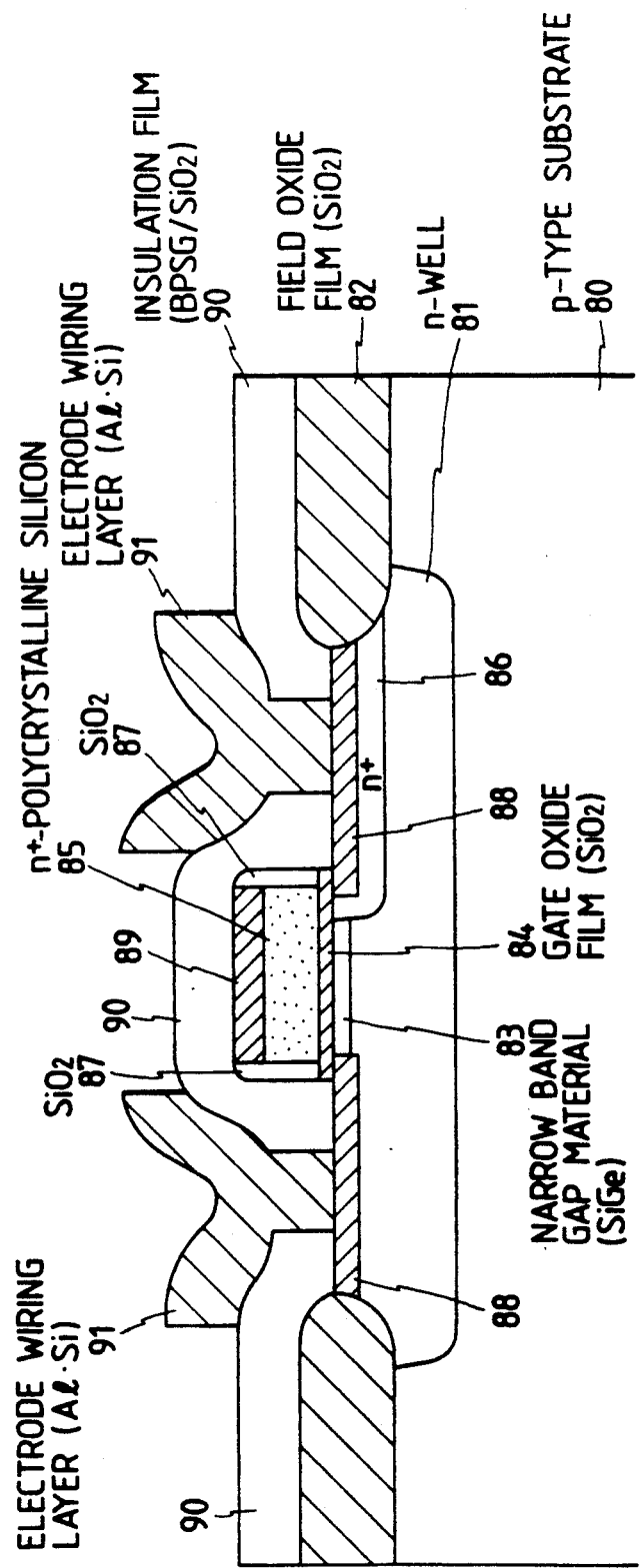
FIG. 10 shows a cross-sectional view of a fifth embodiment of the tunnel injection transistor according to the present invention.

FIG. 10 shows a cross-sectional view of an n-type tunnel injection transistor of still another embodiment of the present invention wherein its leakage current is suppressed in a manner similar to that shown in FIG. 6. The embodiment 6 comprises: a p-type substrate 80; a low impurity concentration n-type well region 81; a narrow band gap member 83 composed of Si$_{0.55}$Ge$_{0.45}$ formed on the surface of said n-type well region 81; a field oxide film (SiO$_2$) 82 which defines an active region; a three-layered gate electrode composed of a gate oxide film (SiO$_2$) 84, an n$^-$-polycrystalline silicon 85 and a platinum silicide (PtSi) 89; a thin film insulation layer (SiO$_2$) 87 formed on the side periphery of the gate; PtSi 88 formed symmetrically in the source and drain within said well region 81, portions of which overlap with the gate electrode thereupon; a high impurity concentration n$^-$-type semiconductor layer 86 formed so as to surround the periphery of PtSi 88 at the drain side; an insulation layer (BPSG/SiO$_2$)90; and an electrode wiring layer 91 for extending connection of the source/drain and the gate to the outside. This embodiment transistor is provided with a narrow band gap member 83 on the surface of the n-type well region 81. The band gap Eg of this Si$_{0.55}$Ge$_{0.45}$ is approximately 0.8 eV, which is smaller by about 0.3 eV than that of Si. Because of the above reason, $\phi_B$ at a Schottky barrier junction between the source PtSi and the Si$_{0.55}$Ge$_{0.45}$ becomes approximately 0.55 eV, which is smaller by approximately 0.3e V than $\phi_B=0.85$ eV at a Schottky barrier junction formed between the bottom portion of the source and the same. Namely, because $\phi_B$ is made smaller only at the portion of the source end through which the tunneling current is injected, only the drain current is affected to be increased while suppressing the leakage current to the minimum.

All of the embodiments hereinbefore described are related to the n-type tunnel injection transistors. A p-type tunnel injection transistor, however, may be readily obtained, for example, in FIG. 6, by forming each of the substrate 40, well region 41, high impurity concentration semiconductor layer 45, and high impurity concentration semiconductor layer 46 to have an opposite conductivity type. In case of providing both n-type and p-type transistors on the same substrate where a large drain current is in demand for both, it is advantageous to utilize a Schottky barrier material having a half value (approximately 0.55 eV) of the band gap $\phi_B$ of silicon. In this regard, it is preferable to employ MoSi$_2$, VSi$_2$, V, TiSi$_2$ or the like. Still further, although in FIG. 8, an SOI type tunnel injection transistor has been described, the same effect is capable of being obtained by replacing the SiO$_2$ substrate with a p-type semiconductor substrate.

Embodiment: 7

Figure 11A:
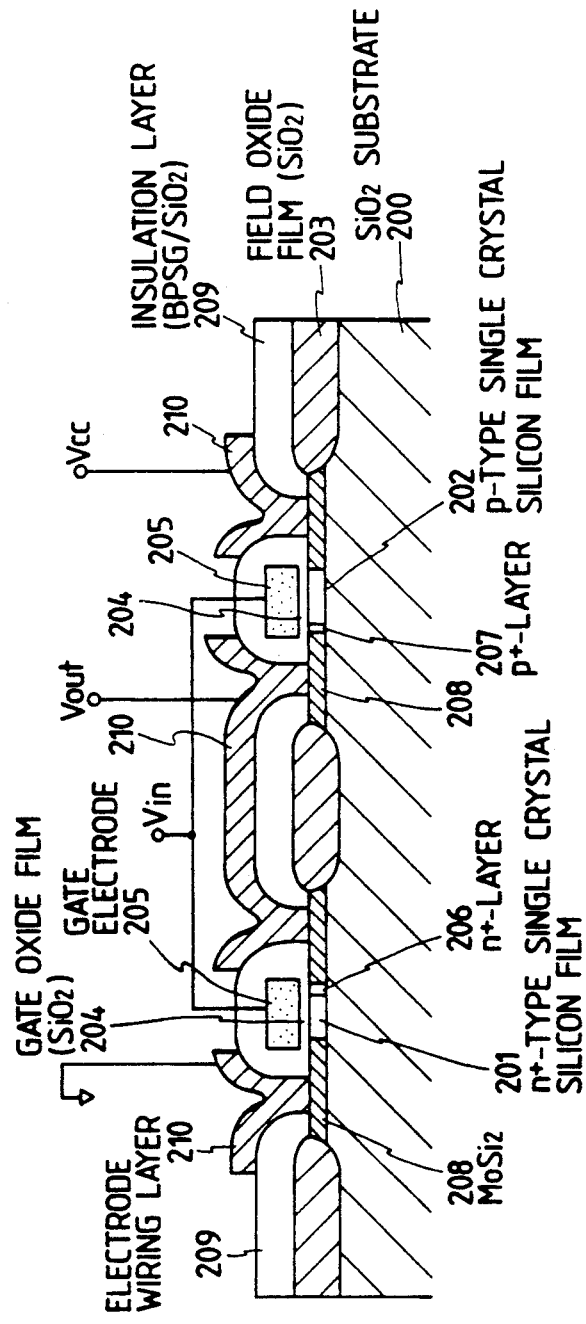
FIGS. 11(a) and 11(b) show a cross-sectional view of the n-type and p-type tunnel injection transistors constituting an inverter circuit and an equivalent circuit thereof, respectively.
Figure 11B:
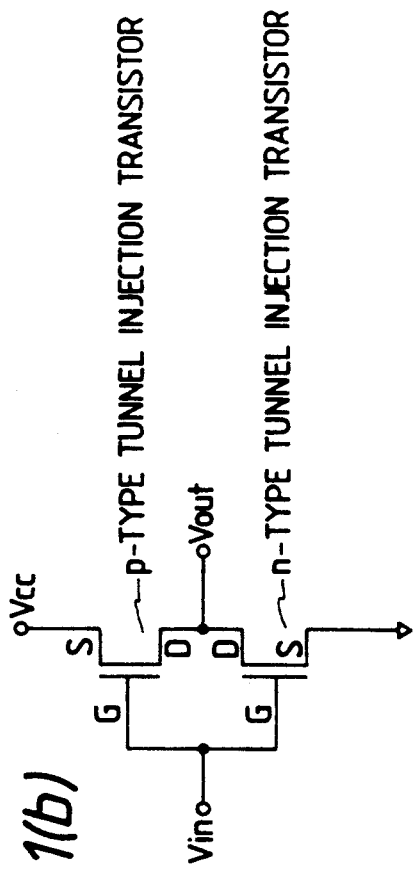

FIG. 11 shows a cross-sectional view of the above-mentioned n-type and p-type tunnel injection transistors integrated on the same substrate constituting an inverter circuit, and its equivalent circuit. This embodiment comprises in combination: an n-type single crystal silicon layer 201 and a p-type single crystal layer 202, each formed on the surface of a SiO$_2$ substrate 200; a field oxide film (SiO$_2$)203 which defines active regions and isolates n-and p-elements by being interposed therebetween; a gate oxide film (SiO$_2$)204; a gate electrode 205; MoSi$_2$, films 208 formed symmetrically at the source and drain sides within said n-and p-type silicon layers 201 and 202, partially overlain by the gate electrode, and the respective bottom surfaces of which are disposed in contact with said SiO$_2$ substrate 200; a high impurity concentration n$^-$-type semiconductor layer 206 and a high concentration p$^-$-type semiconductor layer 207, the former provided between MoSi$_2$ film 208 at the drain and said silicon layer 201, the latter provided between MoSi$_2$ film 208 at the drain and said silicon layer 202; an insulation layer (BPSG/SiO$_2$)209; and an electrode wiring layer 210 for extending connections of respective source/drain and the gate of each element to the outside. This inverter circuit functions similar to a CMOS inverter according to the prior art MOSFETs; whereby a source voltage Vcc is applied to the source of the p-type transistor and an input voltage V$_{in}$ is applied to the common gate, so that an output voltage Vout is obtained. The tunnel injection transistors constituting this device have a small current saturation with respect to the drain voltage, so that they are capable of handling a large drain current flow, and are capable of performing at extremely high speeds because of a sufficiently small parasitic capacitance induced along respective elements between the source and drain.

As hereinabove described, because the transistors according to the present invention are capable of being provided with the same circuit configuration as by the prior art MOSFETs, they can be applied to various types of CMOS logic circuits, and also to BiCMOS logic circuits and memory circuits in combination with bipolar transistors.

As has been described in the embodiments hereinbefore, a device having a small leakage current is capable of being implemented according to the present invention even when the submicron technologies are further enhanced, and the gate length is reduced to less than 0.2 μm, furthermore less than 0.1 μm.

More specifically, a leakage current (reverse current) in this exemplary device is expressed by the following equation (1).

$$I = S \cdot T^2 \exp(-q\phi_B/kT) \qquad (1)$$

where,
S: Schottky barrier junction area
A*: Richardson constant (258.9 Acm$^{-2}$k$^{-2}$)
T: Absolute temperature (K)
q: Electron charge (1.62×10$^{19}$ coulomb)
k: Boltzmann constant (1.38×10$^{-23}$ joule/K)
$\phi_B$: Schottky barrier height (eV)

As shown in FIG. 1, by indicating the gate width as W, gate LOCOS (device isolation region) distance as 1, and silicide thickness as t, then the Schottky barrier junction area S can be expressed by the sum of the bottom surface component (W·l) and the side component (W·t), i.e., S=W·l+W·t. In operative devices where W=15 μm, t=0.05 μm, and gate length=0.2 μm, then 1 becomes approximately 0.8 μm, or when gate length=0.1 μm, 1 becomes approximately 0.6 μm, thus, respective leakage currents in each device of the present invention are given as follows.

1) For the structure of FIG. 1 with a gate length of 0.2 μm:

$$I_1 = 1.78 \cdot 10^{-9} (A).$$

and with a gate length of 0.1 μm:

$$I_1 = 1.36 \cdot 10^{-9} (A)$$

2) For the structures of FIGS. 6 and 8, irrespective of gate length:

$$I_2 = 1.05 \cdot 10^{-10} (A)$$

3) For the structure of FIG. 10 with a SiGe layer thickness of 0.05 μm, irrespective of gate length:

$$I_3 = 1.05 \cdot 10^{-10} (A)$$

Hereinbefore, respective embodiments have been explained as using various materials having different $\phi_B$. In order to compare the leakage currents on the same standard, MoSi$_2$($\phi_B$=0.55 eV) has been utilized here for reference, except for the case of FIG. 10 where it is intended to utilize a higher Schottky barrier height, thus, employing PtSi($\phi_B$=0.85 eV) for comparison.

As are obvious from the above comparisons, the cases of FIGS. 6, 8 and 10 are capable of reducing their leakage currents to approximately one tenth that of FIG. 1. All of these results from the elimination of the bottom components(W·l) at the Schottky barrier junctions. Namely, in the cases of FIGS. 6, 8 and 10, the leakage currents depend entirely on the thickness of metal or metal compound electrodes.

According to the present invention, a preferable structure for semiconductor devices suitable for enhancing higher density integration, and a process of its manufacture are capable of being implemented.

Further, according to the present invention, a semiconductor device having increased switching speeds is capable of being obtained.

What we claim is:

1. A semiconductor device comprising:
a substrate having a first surface;
a first semiconductor region of a first conductivity type extending from the first surface into the substrate;
a second semiconductor region of the first conductivity type extending from the first surface into the first semiconductor region, the second semiconductor region having a higher impurity concentration than that of the first semiconductor region;
a third semiconductor region of a second conductivity type opposite to that of the first semiconductor region, the third semiconductor region extending from the first surface into the first semiconductor region and having a predetermined low impurity concentration;
a drain region extending from the first surface into the second semiconductor region, the drain region being comprised of one of a metal and a metal compound;
a source region extending from the first surface into the first semiconductor region, the source being comprised of one of a metal and a metal compound;
a drain electrode located on the drain region;
a source electrode located on the source region;
an insulating film on the first surface, disposed at least on a portion of the first semiconductor region located between the drain and source regions; and
a control electrode on the insulating film and overlying the portion of the first semiconductor region located between the drain and the source regions;
wherein a Schottky barrier junction is provided between the source region and the third semiconductor region while an ohmic contact is provided between the drain region and the second semiconductor region;
wherein the predetermined low impurity concentration of the third semiconductor region is set so that leakage current in a reverse direction of said Schottky barrier junction is reduced without affecting forward characteristics of the Schottky barrier junction; and
wherein a tunneling current flowing across the Schottky barrier junction between the source and the drain regions is controlled by a control voltage applied to the control electrode.

2. A semiconductor device comprising:
a substrate having a first surface;
a first semiconductor region of a first conductivity type extending from the first surface into the substrate;
a second semiconductor region of the first conductivity type extending from the first surface into the first semiconductor region, the second semiconductor region having a higher impurity concentration than that of the first semiconductor region;
a drain region extending from the first surface into the second semiconductor region, the drain region being comprised of one of a metal and a metal compound;
a source region extending from the first surface into the first semiconductor region, the source being comprised of one of a metal and a metal compound;
a third semiconductor region of the first conductivity type extending from the first surface into the first semiconductor region, coupled to the source region, and having a smaller band gap than that of the first semiconductor region;

a drain electrode located on the drain region;
a source electrode located on the source region;
an insulating film on the first surface, disposed at least on the third semiconductor region;
wherein a Schottky barrier junction is provided between the source region and the first and third semiconductor regions while an ohmic contact is provided between the drain region and the second semiconductor region;
wherein a tunneling current flowing across the Schottky barrier junction between the source and the drain regions is controlled by a control voltage applied to the control electrode.

3. A semiconductor device according to claim 2, wherein the band gap Eg of the third semiconductor region is approximately 0.8 eV.

4. A semiconductor device comprising:
a substrate having a first surface;
a first semiconductor region of a first conductivity type extending from the first surface into the substrate;
a second semiconductor region of the first conductivity type extending from the first surface of the insulating substrate adjacent to the first semiconductor region, the second semiconductor region having a higher impurity concentration than that of the first semiconductor region;
a drain region formed on the first surface of the insulating substrate, coupled to the second semiconductor region, and comprised of one of a metal and a metal compound;
a source region formed on the first surface of the insulating substrate, coupled to the first semiconductor region, and comprised of one of a metal and a metal compound;
a drain electrode located on the drain region;
a source electrode located on the source region;
an insulating film on the first surface, disposed at least on the third semiconductor region; and
a control electrode on the insulating film and overlying the first semiconductor region;
wherein a Schottky barrier junction is provided between the source region and the first semiconductor region while an ohmic contact is provided between the drain region and the second semiconductor region; and
wherein a tunneling current flowing across the Schottky barrier junction between the source and the drain regions is controlled by a control voltage applied to the control electrode.

* * * * *